US012132461B2

(12) United States Patent
Parrott et al.

(10) Patent No.: US 12,132,461 B2
(45) Date of Patent: Oct. 29, 2024

(54) MAGNETICALLY TUNABLE FERRIMAGNETIC FILTER

(71) Applicant: Integrated Microwave Corporation, Itasca, IL (US)

(72) Inventors: Ronald Parrott, Sun City Center, FL (US); Szu-Fan Wang, El Cerrito, CA (US); Robert Cordis, Windsor, CA (US); Martin Hernandez, Santa Rosa, CA (US)

(73) Assignee: INTEGRATED MICROWAVE CORPORATION, San Diego, CA (US)

( * ) Notice: Subject to any disclaimer, the term of this patent is extended or adjusted under 35 U.S.C. 154(b) by 220 days.

(21) Appl. No.: 17/818,529

(22) Filed: Aug. 9, 2022

(65) Prior Publication Data

US 2023/0048990 A1 Feb. 16, 2023

Related U.S. Application Data

(60) Provisional application No. 63/260,140, filed on Aug. 10, 2021.

(51) Int. Cl.
*H01P 1/218* (2006.01)
*H01F 1/34* (2006.01)
*H01F 27/02* (2006.01)
*H01F 27/28* (2006.01)
*H03H 7/01* (2006.01)

(52) U.S. Cl.
CPC ........... *H03H 7/0138* (2013.01); *H01F 1/344* (2013.01); *H01F 27/02* (2013.01); *H01F 27/28* (2013.01); *H01P 1/218* (2013.01)

(58) Field of Classification Search
CPC .......... H01P 1/218; H01P 1/217; H01P 1/215; H01P 1/20; H01P 7/06; H01P 7/065; H01P 7/00; H03B 5/1882; H03B 2201/0241
See application file for complete search history.

(56) References Cited

U.S. PATENT DOCUMENTS

| 4,179,674 A | 12/1979 | Keane et al. |
| 4,247,837 A | 1/1981 | Mezak et al. |
| 4,480,238 A | 10/1984 | Iwasaki |
| 4,500,858 A | 2/1985 | Mezak |
| 4,857,871 A | 8/1989 | Harris |
| 5,221,912 A | 6/1993 | Keane et al. |
| 5,291,163 A | 3/1994 | Finkle et al. |

(Continued)

FOREIGN PATENT DOCUMENTS

EP 0285326 A2 10/1988

OTHER PUBLICATIONS

Micro Lamda, Inc.: "YIG-tuned Filters Shrink Size to 1" Cubes", Product Technology, Duplicated from the Microwave Journal Jun. 1994, Horizon House Publication, Inc. 1994.

*Primary Examiner* — Stephen E. Jones
(74) *Attorney, Agent, or Firm* — Hickman Becker Bingham Ledesma LLP; Matthew C. Loppnow

(57) ABSTRACT

A magnetically tunable ferrimagnetic filter, including a top casing, a top magnetic conductor, a bottom magnetic conductor, coils, a balance coil, ferrimagnetic-based filters, and a bottom casing. The ferrimagnetic-based filters utilize ferrimagnetic resonator elements, such as yttrium-iron-garnet (YIG), configured to reduce a magnetic gap of the YIG filter and thereby to improve performance.

18 Claims, 15 Drawing Sheets

(56) References Cited

U.S. PATENT DOCUMENTS 5,418,507 A * 5/1995 Keane .................. H01P 1/218
                                                    333/202
7,504,912 B2    3/2009 Aigle et al.

* cited by examiner

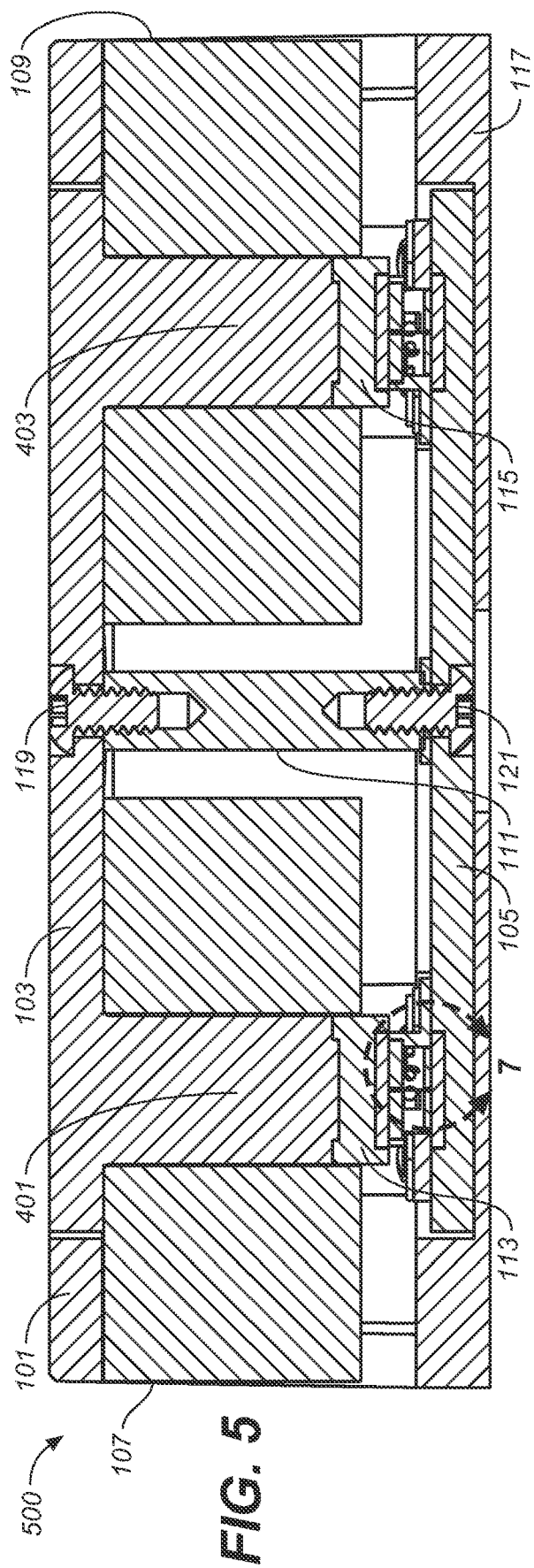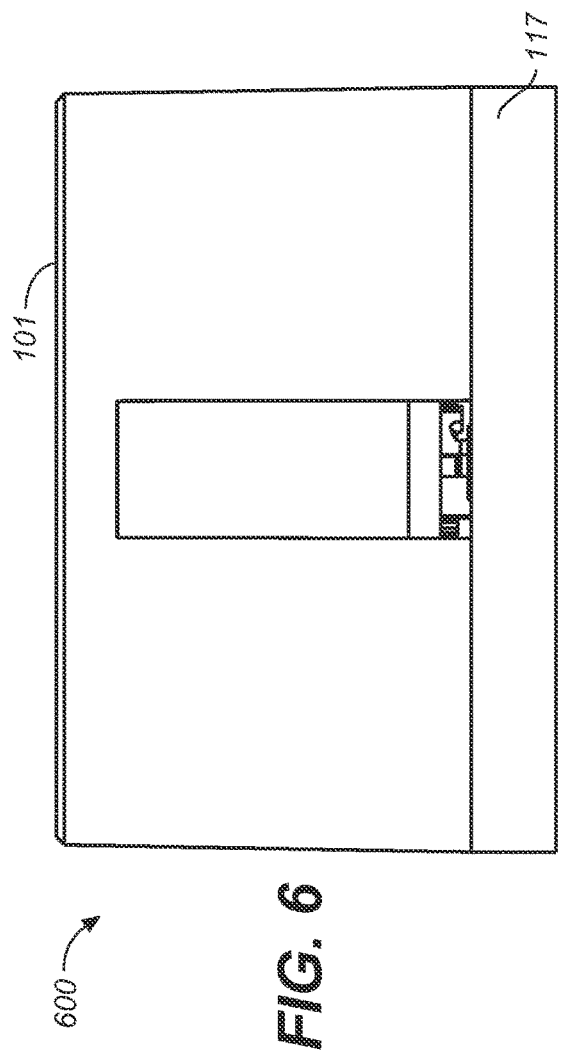

GRAPH 1

MAGNETICALLY TUNABLE FERRIMAGNETIC FILTER

CROSS REFERENCES TO RELATED APPLICATIONS

The present application claims the benefit of the filing date of U.S. Provisional Patent Application Ser. No. 63/260,140, filed Aug. 10, 2021 (Aug. 10, 2021), which application is incorporated in its entirety by reference herein.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION BY REFERENCE OF MATERIAL SUBMITTED ON A COMPACT DISC

Not applicable.

BACKGROUND OF THE INVENTION

Field of the Invention

The present invention relates most generally to electronic filters and oscillators, and more particularly, the present invention relates to a magnetically tunable ferrimagnetic filter.

Background Discussion

The practical design and the construction of ferrimagnetic-based filters and oscillators (e.g., YIG-based filters and oscillators) are challenging due to conflicting requirements in fundamental physics that must nonetheless be addressed simultaneously. The ferrimagnetic resonance property of YIG makes possible the production of external field electron spin resonators with high Q resonances for microwave circuits. To achieve the high Q value, the YIG material must be immersed in a magnetic bias field. The magnetic bias field has a fundamental tuning constant of 2.8 MHz per Gauss. Providing such a field efficiently is a challenge that drives the size, weight, power, and cost (SWaP-C) of such filters and oscillators effectively outside the range of commercial feasibility. Additionally, the central area of a working gap in ferrimagnetic-based filters grows dramatically as the number of stages increases. Furthermore, tracking becomes unmanageable as the number of stages increases because tuning one YIG sphere inevitably changes its nearest neighbors.

Accordingly, there remains a need for a ferrimagnetic-based filter design that can be embodied as, or incorporated in, a device of compact size, exceptional noise figure performance, efficient power consumption, which is also adapted for manufacture in large volumes.

BRIEF SUMMARY OF THE INVENTION

To address shortcomings in the prior art, the present invention provides a magnetically tunable ferrimagnetic filter. The magnetically tunable ferrimagnetic filter includes a top casing, a top magnetic conductor, a bottom magnetic conductor, a Frequency Tuning Coil (FTC), means for tracking the ferrimagnetic-based filters over the tuning frequency, a bottom circuit assembly, and assembly screws. The top casing and the bottom casing are configured to enclose different parts of the magnetically tunable ferrimagnetic filter, including, but not limited to, the top magnetic conductor, the bottom magnetic conductor, the Frequency Tuning Coils, a balance coil to synchronize/track the filters, and the ferrimagnetic-based filters.

In an embodiment, the ferrimagnetic-based filters utilize ferrimagnetic resonator elements, such as yttrium-iron-garnet (YIG). Accordingly, the ferrimagnetic-based filters considered in the instant disclosure are referred to as YIG filters, although other ferrite class materials may be used, including Nickel-Zinc-Ferrite, Barium-Ferrite, and others.

According to an embodiment, dielectric, ferrite, and hybrid materials (metamaterials) may be assembled and configured to reduce the size of the YIG filter. A reduction in size of the YIG filter is made possible by using small diameter spheres and a novel construction to reduce filter complexity. This enables a working magnetic gap that is only slightly larger than the sphere diameter. Therefore, in an embodiment, the YIG filter may include a top metallic plate placed at a top portion of a puck, a bottom metallic plate placed at a bottom portion of the puck to assure magnetic bias field uniformity; also, a top dielectric material, a bottom dielectric material adjacent to the YIG spheres, and a conductor for RF near (and possibly encircling or partially encircling) the sphere inside the puck. In some embodiments, the top dielectric material and the bottom dielectric material are of a high dielectric constant to substantially reduce the RF wave velocity. The top dielectric material and the bottom dielectric material are connected to the top metallic plate and the bottom metallic plate, respectively. The top dielectric material and the bottom dielectric material are configured to confine and shape a tight contour of RF flux lines that conserve flux conservation laws. Further, the previously described conductor is a radio frequency (RF) structure designed to couple high frequency electromagnetic (RF) energy to a YIG sphere and generates a coupling coefficient (CC) used to predict the filter performance. In this embodiment the filter CC is applied to a low pass prototype model on the input and output ports and will be generally referred to as CCP. Prior art would require more coupling structures, but the present invention employs sphere-to-sphere coupling so that additional coupling structures are not required.

As described in more detail below, FIG. 9 shows an example of the design features of two band pass 3 YIG resonator filters in series connected by a TEM transmission line. And each are magnetically biased between the working gap faces and the filters as shown FIG. 9A, showing two single filter side views details, with a high dielectric intermediate between the pole faces in filter 901 and with the dielectric removed in filter 903.

The foregoing summary broadly sets out the more important features of the present invention so that the detailed description that follows may be better understood, and so that the present contributions to the art may be better appreciated. There are additional features of the invention that will be described in the detailed description of the preferred embodiments of the invention which will form the subject matter of claims in related patents claiming priority to this application.

Accordingly, before explaining the preferred embodiment of the disclosure in detail, it is to be understood that the disclosure is not limited in its application to the details of the construction and the arrangements set forth in the following description or illustrated in the drawings. The inventive apparatus described herein is capable of other embodiments and of being practiced and carried out in various ways.

Also, it is to be understood that the terminology and phraseology employed herein are for descriptive purposes only, and not limitation. Where specific dimensional and material specifications have been included or omitted from the specification or the claims, or both, it is to be understood that the same are not to be incorporated into the appended claims.

As such, those skilled in the art will appreciate that the conception on which this disclosure is based may readily be used as a basis for designing other structures, methods, and systems for carrying out the several purposes of the present invention. It is important, therefore, that the claims are regarded as including such equivalent constructions as far as they do not depart from the spirit and scope of the present invention. Rather, the fundamental aspects of the invention, along with the various features and structures that characterize the invention, are pointed out with particularity in the claims filed concurrently herein. For a better understanding of the present invention, its advantages and the specific objects attained by its uses, reference should be made to the accompanying drawings and descriptive matter in which there are illustrated the preferred embodiment.

BRIEF DESCRIPTION OF SEVERAL VIEWS OF THE DRAWINGS

The invention will be better understood and objects other than those set forth above will become apparent when consideration is given to the following detailed description thereof. Such description makes reference to the annexed drawings wherein:

FIG. 5 is a cross-sectional side view of an embodiment of the magnetically tunable ferrimagnetic filter including the YIG filters.

FIG. 6 is an end view in elevation thereof.

DETAILED DESCRIPTION OF THE INVENTION

Figure 1:
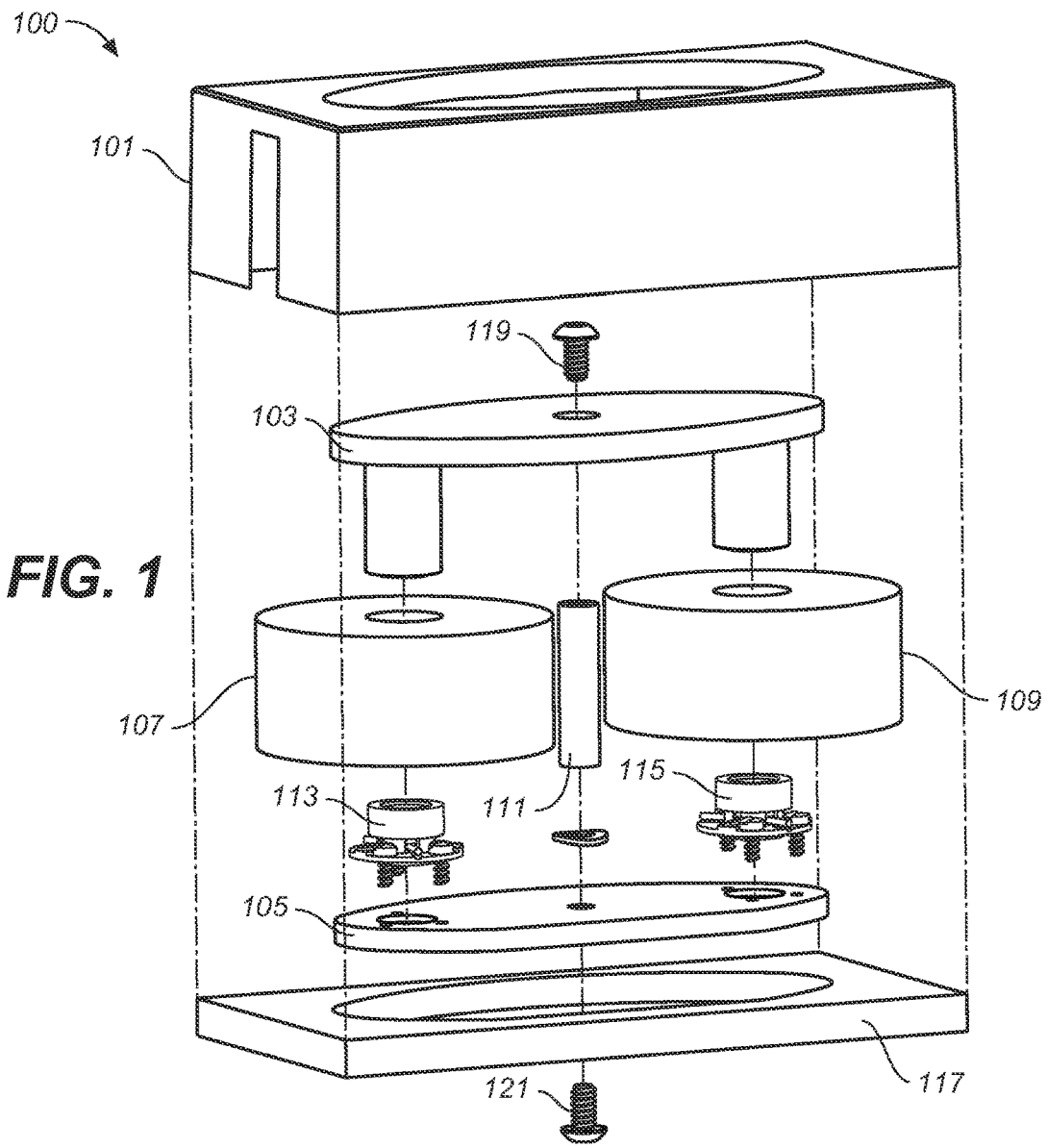
FIG. 1 is an exploded perspective side view of the magnetically tunable ferrimagnetic filter of the present invention, according to an embodiment.
Figure 2:
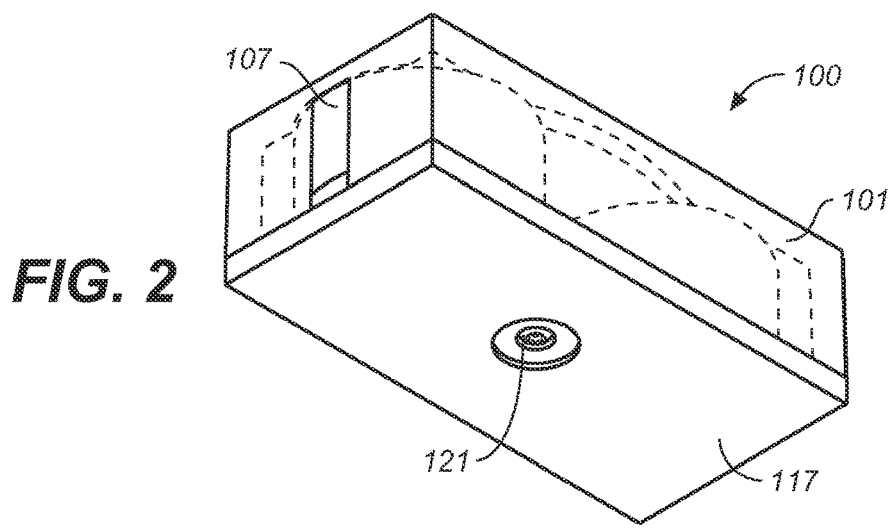
FIG. 2 is a bottom perspective view of an assembled magnetically tunable ferrimagnetic filter, according to some embodiments.
Figure 3:
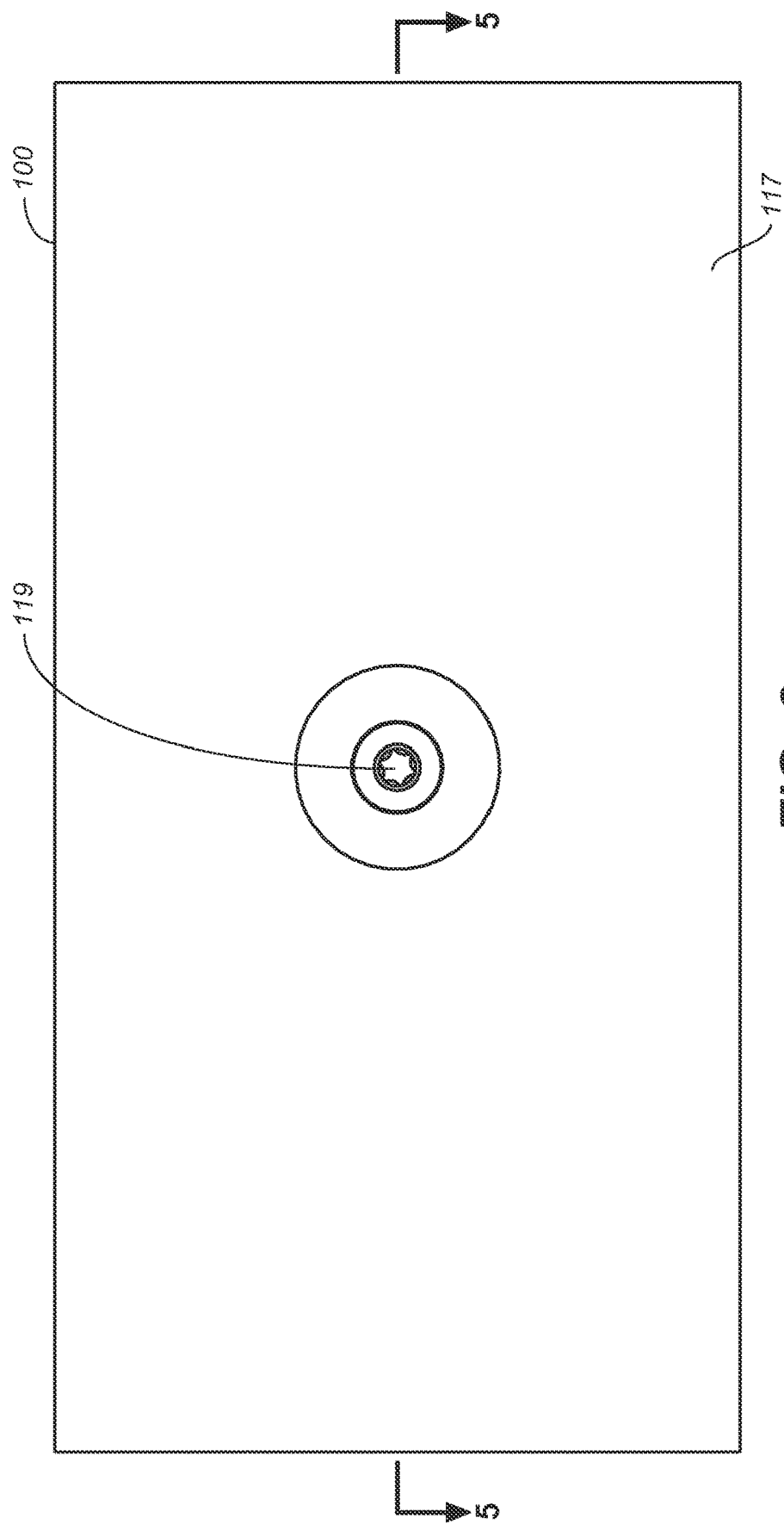
FIG. 3 is a bottom view of the magnetically tunable ferrimagnetic filter, according to some embodiments and is the mounting surface for to a mother board.

Referring first to FIGS. 1-3, there is shown an exploded view of a magnetically tunable ferrimagnetic filter 100 according to some embodiments of the invention. FIG. 1 is an exploded perspective view of a magnetically tunable ferrimagnetic filter 100, FIG. 2 is a lower perspective view of the assembled filter, and FIG. 3 is a bottom view thereof. The magnetically tunable ferrimagnetic filter includes a housing with a top casing 101, a top magnetic conductor 103, a bottom magnetic conductor 105, first and second tuning coils 107 and 109, an optional balance coil 111, first and second ferromagnetic-based filters 113 and 115, a bottom casing (or component circuit board) 117, and assembly screws or other fasteners 119 and 121. The top casing 101 and the component circuit board 117 are configured to enclose component parts of the magnetically tunable ferrimagnetic filter 100, such as, but not limited to, the top magnetic conductor 103, the bottom magnetic conductor 105, coils 107 and 109, the optional balance coil 111, and the ferromagnetic-based filters 113 and 115. When the optional balance coil is not used, a supporting strut replaces it to connect the top and bottom magnetic conductors, 103, 105.

In an embodiment, the ferromagnetic-based filters 113 and 115 utilize ferrimagnetic resonator elements, for example, yttrium-iron-garnet (YIG). To that end, the ferrimagnetic-based filters 113 and 115 are referred to herein as YIG filters. YIG is a ferrite with a very high resistivity and a ferrimagnetic resonance that tunes 2.8 MHz/Gauss. Additionally, YIG has an extremely high unloaded Q characteristic resulting in low intrinsic losses. To calculate the coupling coefficients, we start with equivalent inductance of the input loop:

$$L_y = \frac{\mu_o \omega_m V_m (\sin\beta l_2 - \sin\beta l_1)^2}{\omega_o 16\pi^2 r^2 \beta^2}$$

Equation 1

Where $L_y$ = inductance in henries $\mu_o$ = permeability of free space $1.256 \times 10^{-6}$ henries/meter $V_m$ = volume of the YIG sphere in meters$^3$ $\beta$ = propagation velocity the medium, in radians/meter $l_2$ = length of the coupling loop from the short circuit to the end of coupling loop, in meters $l_1$ = length of the coupling loop from the short circuit to the start of the coupling loop, in meters $\omega_o$ = resonant frequency of the sphere in radians/second $r$ = radius of the coupling loop in meters and $\omega_m = \mu_o \gamma M_s$ where $\gamma$ = gyromagnetic ratio, $1.759 \times 10^{11}$ (MKS units)

$M_s$ = saturation magnetization of the material (MKS units)

The sine terms in Equation 1 account for the cosine variation of RF current along the length of the loop.

The equivalent capacitance Cy of the resonant circuit is obtained from Equation 2.

$$\omega_o^2 = \frac{1}{L_y C_y}$$

Equation 2

Note: the coupling loop should be treated as a transmission line with a characteristic admittance, $Y_1$ and length $l_0$. Therefore, the coupling loop will transform $G_0$ to an equivalent conductance $G_p$ across the lumped element resonator by the real part of the transformer expression:

$$G_p = R_e\left[Y_1 \frac{G_o + jY_1 \tan\beta l_o}{Y_1 + jG_o \tan\beta l_o}\right]$$

Equation 3

The external $Q_c$ q of the input and output resonator in the filter is given by Equation 4.

$$Q_e = \frac{f_o}{BW_e} = \frac{1}{\omega_o L_y G_p}$$

Equation 4

The effective Q for the internal coupling between the input resonator and the subsequent resonators is more complicated to model, as there is no conductive material to contain the RF flux in embodiments using sphere-to-sphere coupling. Testing has demonstrated that this technique depends on the RF path length and wave velocity. Therefore, the spacing between spheres and the sphere diameter along with the effective dielectric constant determines the coupling coefficient. Experience has shown that it does not change as prior art but the proper dielectric material for the rf flux and the YIG position will be able to synchronize the coupling coefficient to maintain bandwidth over frequency.

Figure 16:
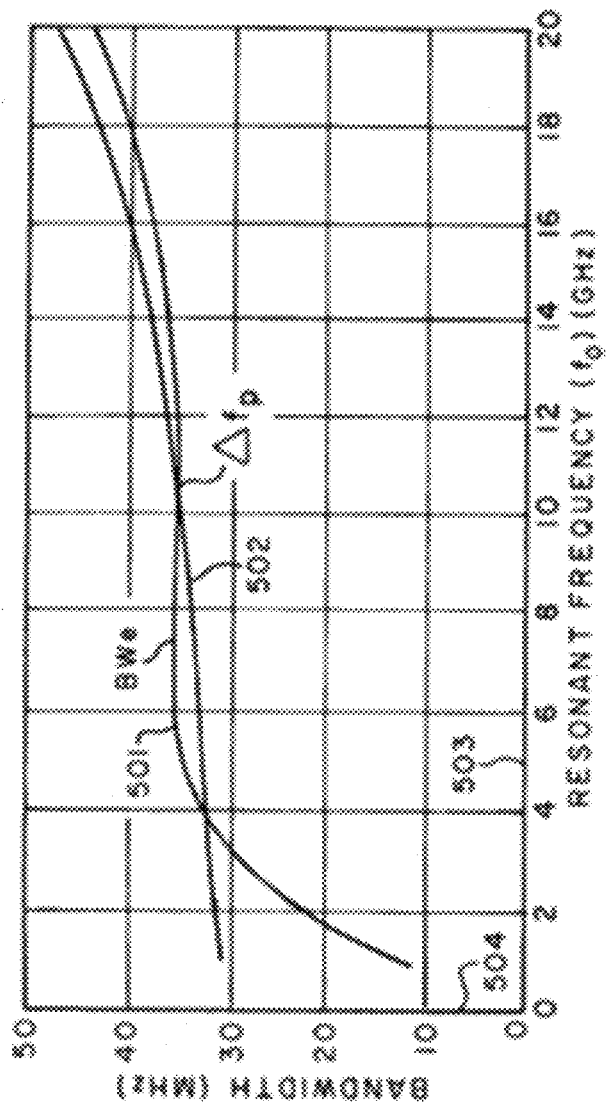
FIG. 16 is an example tuning bandwidth tracking graph.

FIG. 16 is an example tuning bandwidth tracking Graph 1. Graph 1, 504 shows the effect of internal filter tracking. Ideally, the bandwidth estimation (BWe) 501 and the $\Delta f_p$, 502, will overlie the required bandwidth at all required resonance frequencies. This example holds through the 4-10 GHz range and is simple to align. The BWe 501 can be calculated with high accuracy, but the $\Delta f_p$ must be measured using Q test structures.

Figure 4:
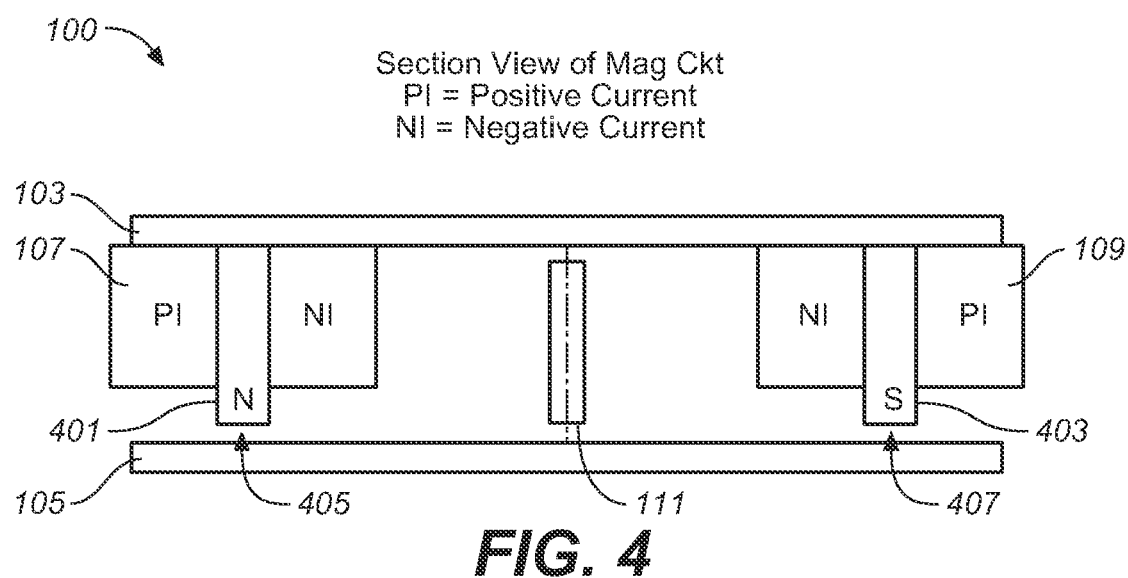
FIG. 4 is a simplified schematic cross-sectional side view in elevation of a magnetic circuit of the magnetically tunable ferrimagnetic filter without yttrium-iron-garnet (YIG) filters in place at the pole gaps, according to some embodiments.

Referring next to FIG. 4, there is shown a schematic cross-sectional side view of a magnetic circuit of the inventive filter 100 excluding YIG filters 113 and 115 (as shown in FIG. 1) at the pole gaps 405, 407. A gap or space 405 exists between a first pole 401 and the bottom magnetic conductor 105. Likewise, a gap or space 407 exists between a second pole 403 (opposite in polarity to that of the first) and the bottom magnetic conductor 105. The spaces 405 and 407 are referred to as working gaps in the magnetic circuit. In an embodiment, the YIG filters 113 and 115 are installed in the working gaps 405 and 407, respectively. As may be appreciated, FIG. 4 is simplified view of a magnetic circuit that shows the core parts of the instant invention. The pole gaps, 405 and 407, control reluctance, thus airgaps of the magnetic circuit consisting of 103, 401, 105, and 403. The force in the circuit is the series electron flow in 107 and 109.

As used in FIG. 4, "PI" indicates a positive current in the coil, and "NI" indicates a negative current in the coil, 107 and 109, respectively. When energized the coils 107 and 109, having opposing current flow, produce a magnetic field with a circular path through the top magnetic conductor 103, the bottom magnetic conductor 105, the poles 401 and 403, and the working gaps 405 and 407. This enables increased efficiency despite the smaller physical cross-section. In addition, the large surface areas of the top magnetic conductor 103 and the bottom magnetic conductor 105 improve skin depth control during EMF changes, thereby improving switching speed. Equation 5 below will predict the skin depth, δ, to demonstrate this effect.

$$\delta := \sqrt{\left(\frac{\rho}{\pi \cdot f_0 \cdot \mu_r \cdot \mu_0}\right)}$$ Equation 5

Example for C49 Steel (The material used in the filter.)

$\mu_0 := 4 \cdot \pi \cdot 10^{-7}$ $\mu_0 = 1.257 \cdot 10^{-6}$ $\mu_r = 1$ $\rho = 72 \cdot 10^{-6} \cdot \Omega \cdot cm$ For a frequency tuning rate of 1 MHz/millisecond $$f_0 := \frac{2.8}{ms} \quad f_0 = (2.8 \cdot 10^3) \frac{1}{s} \quad \delta = 317.741 \text{ mil}$$

For non-magnetic material

Example $\delta = 1.421$ mil

For C49 material

As can be seen, the coil magnetic flux hardly penetrates the material when the coil is rapidly tuned or stepped. The problems generated are multifold. Since the magnetic flux is confined during frequency transition to the surface, the B field saturates the material, establishing a hysteresis remanent field in parallel to the emf. This has been demonstrated in oscillator tuning because at fast slew rates the oscillator always settles to a final frequency from a higher frequency regardless of the direction of the tuning step. And, when observed carefully, one can measure the establishment of the material Mu, $\mu_r$, through various cycles not related to the coil current. An unsurmountable difficulty is created to determine the exact current required to tune to the desired frequency, because it depends on a multitude of non-linear effects of hysteresis. One solution is to use ferrite material. This is because the Rho, ρ, is infinity, but that can only be practical in the pole pieces and only for low frequencies, due to the low saturation of the ferrites. For the return path a high Mu material is more practical. In prior art, the return path is a cup core that is large and slow tuning; thus in embodiments, there are elliptical return paths that are thin with the cross section increasing to the midpoint. Using the series coils the B in the middle between the coils tends towards zero, which is why the balance coil is effective and why the skin effects are mitigated. Work can be done to optimize the design, but testing demonstrates that the basic concept is valid and these optimizations are thought to be extensions of the present invention.

In some embodiments, the balance coil 111 is employed to align the working gaps 405 and 407 (thus both YIG filters 113 and 115) to the same gauss level, and thereby to the same frequency. In some implementations, a null magnetic point may be provided on the top magnetic conductor 103 and the bottom magnetic conductor 105. The null magnetic point is a location where EMF may be added to the working gap 405 while simultaneously subtracted from the working gap 407 to balance both YIG filters 113 and 115 to the same frequency. In other implementations, due to parasitic magnetic leakage, working gaps 405 and 407 may be further balanced by leaking a part of electrical enabling current around one of the coils 107 and 109 through a resistor. This balances YIG filters 113 and 115 by reducing the ampere turns in the affected coil. If tuning speed is not an issue and the tuning range is low, then the coils can be operated in parallel and individually controlled to track YIG filters 113 with 115.

Further, in some alternate embodiments, the magnetically tunable ferrimagnetic filter 100 may employ a permanent magnet to save power and to improve the switching speed. For instance, the bottom magnetic conductor 105 may be fabricated from or incorporate a ferromagnetic material (e.g., alnico) or a magnetic metamaterial. The incorporated ferromagnetic material has magnetic conductance while also generating an external field which is used to magnetically bias the YIG when no current is present (quiescent frequency). In addition, due to the internal Mu, the incorporated ferromagnetic material provides a return path to couple the coils 107 and 109 with one another.

FIG. 5 is a cross-sectional view in elevation 500 of an actual reduction to practice of the magnetically tunable ferrimagnetic filter of the present invention 100 including the YIG filters and shows typical filter regions. This provides further detail as a complement to FIG. 4. FIG. 6 is an end cut away view thereof 600.

Figure 7:
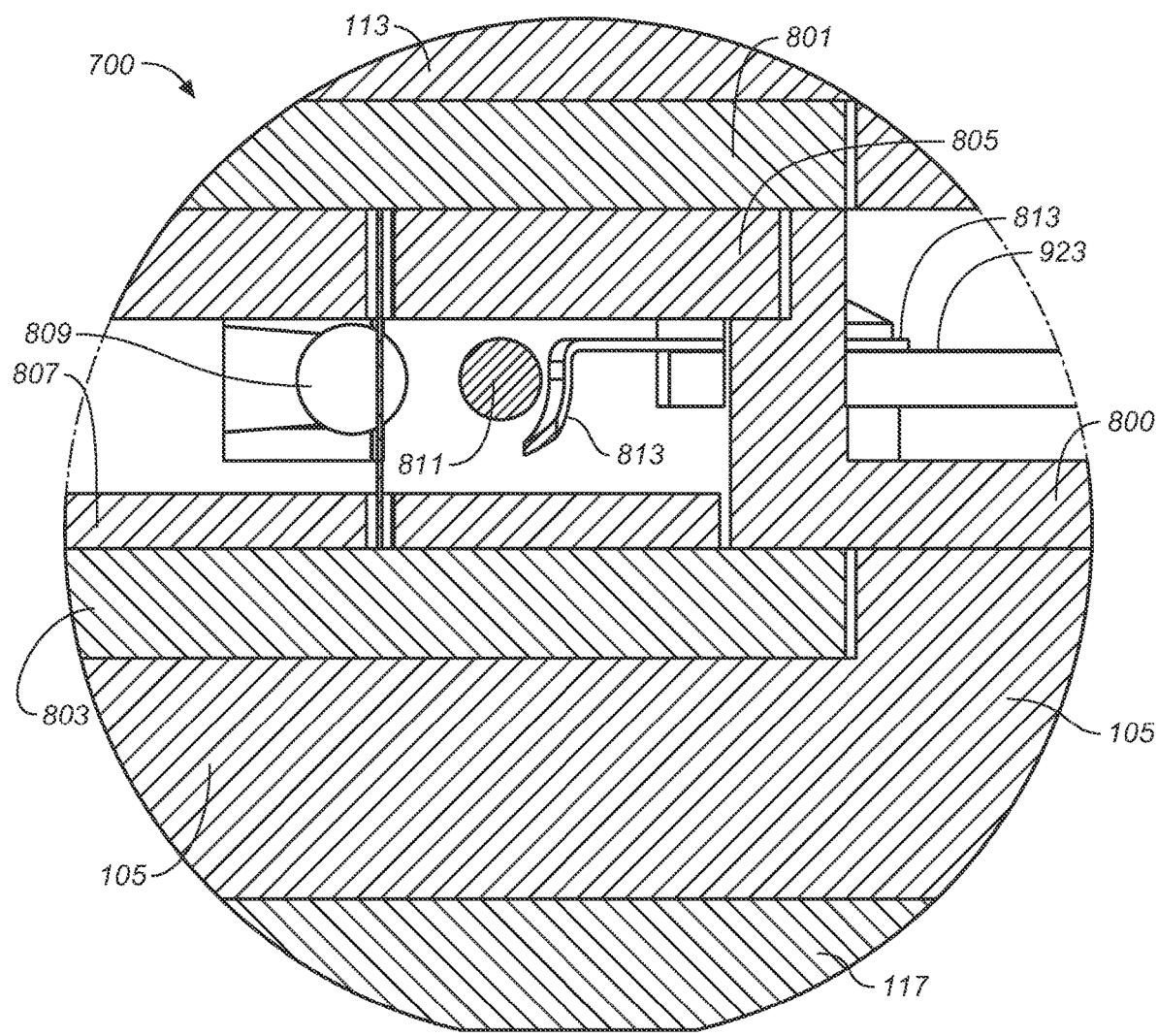
FIG. 7 is a detailed side view of a cross-section of the magnetically tunable ferrimagnetic filter taken along section 6 of FIG. 5.

FIG. 7 is a detailed cross-sectional side view 700 taken along section 7-7 of FIG. 5, showing the details of the typical airgap. Magnetic material for the bias circuit, 113 and 105 forms the boundaries that contain the filter, more clearly seen in FIG. 8.

Figure 8:
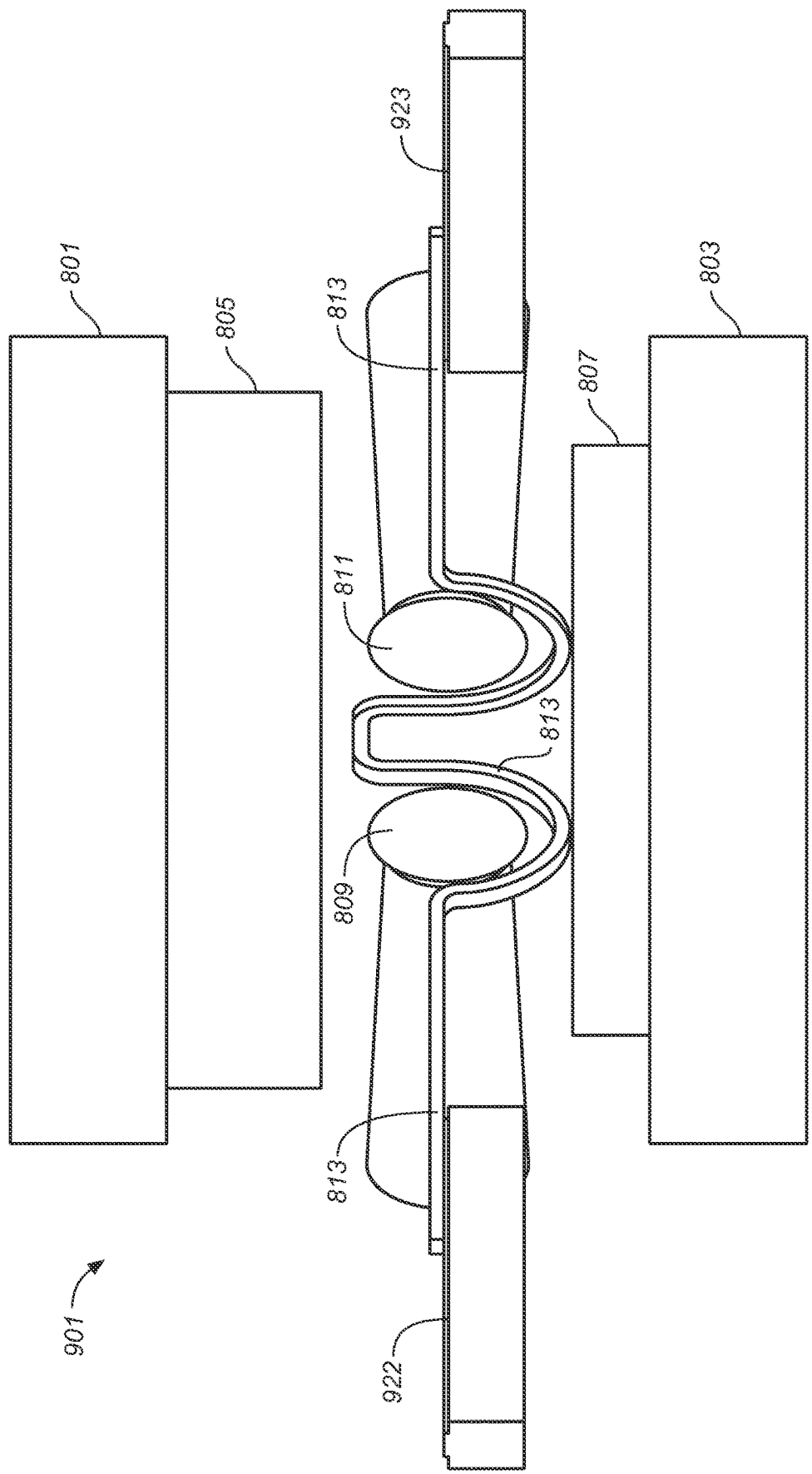
FIG. 8 is a side view in elevation thereof showing device structures for input and output coupling conductors.

FIG. 8 is a cross-sectional view of YIG filter 113, with a special focus on the YIG resonators. And as explained more fully below, the description of YIG filter 113 applies equally to YIG filter 115. Here it is seen that the YIG filter 113 includes a top metallic plate 801, disposed above a mounting platform or puck 800, a bottom metallic plate 803, each magnetic material to aid in setting parallel lines of flux in the airgap, i.e., to linearize the field in the working gap. Next, a top dielectric material 805 is disposed between the mounting platform and the top metallic plate, a bottom dielectric material 807 is disposed between the bottom metallic plate and the mounting platform to control the RF flux in the YIG spheres 809, 809a (FIG. 12 only), and 811, and a metal loop 813. In some embodiments, the top dielectric material 805 and the bottom dielectric material 807 are materials having high dielectric constants (Epsilon, ε). The top dielectric material 805 and the bottom dielectric material 807 are connected to the top metallic plate 801 and the bottom metallic plate 803, respectively. The top dielectric material 805 and the bottom dielectric material 807 are configured to confine and shape a tight contour of RF flux lines and to maintain the conservation of flux rules such as entering the spheres orthogonally. If that is not possible due to restraints imposed by conductors, then extreme loss may be expected. Further, the metal loop 813 is a radio frequency (RF) coupling loop that couples RF to the YIG spheres 809, 809a, and 811. The configuration of the YIG filter 113 reduces the magnetic gap and improves the performance of the filter by reducing loss in the crossover sphere (not shown). The working gap fundamentally controls the overall size of a filter by conservation of flux.

FIG. 8 demonstrates unique features of the present invention. The upper and lower magnetic materials help set parallel lines of flux in the airgap while other material in the airgap has a Mu near 1, other than the spherical YIG resonators, 809. 811, which have a Mu of about 12 to the bias field. This permeability is sufficient to control the DC flux lines so that they enter perpendicular to the surface of the YIG spheres. This is necessary to minimize Walker modes.

YIG filters 113 and 115 are similarly configured; thus, the foregoing features and characteristics with reference to filter 113 of FIG. 8 apply equally to YIG filter 115.

Figure 9:
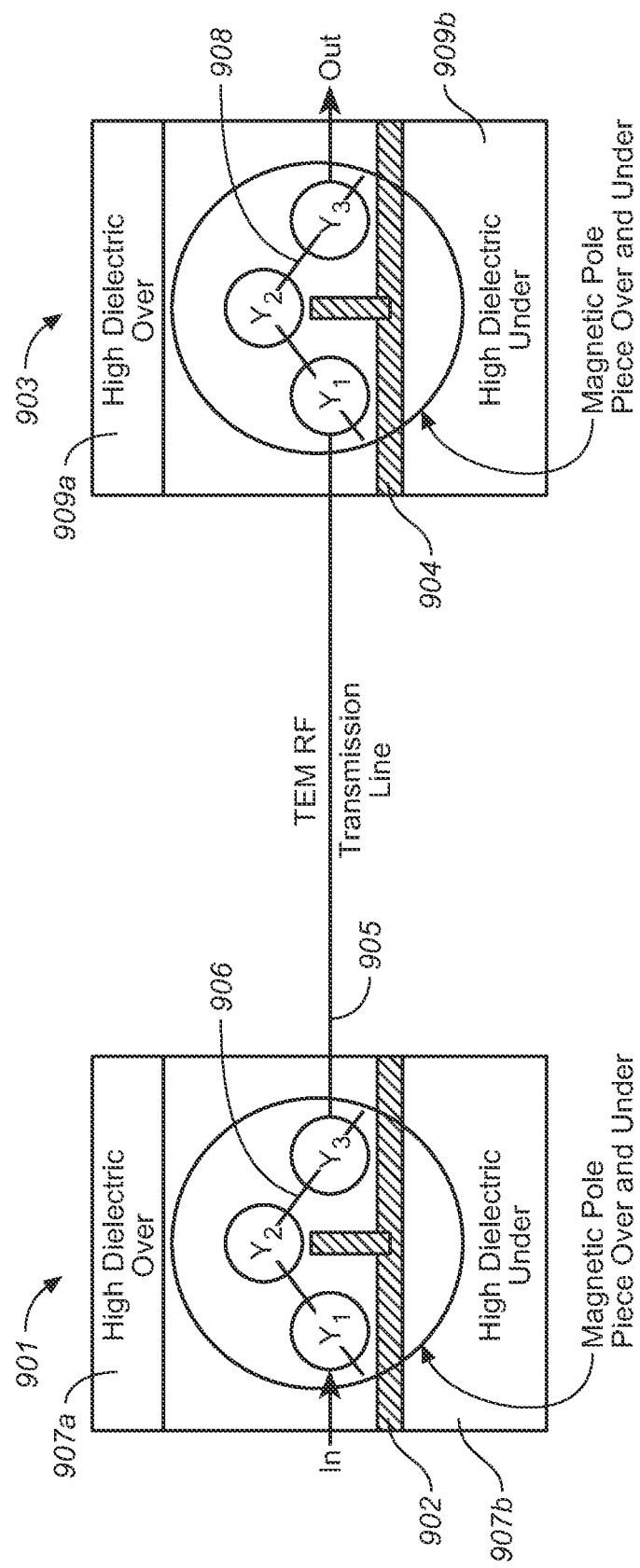
FIG. 9 is a schematic cross-sectional side view showing the inventive YIG band pass filters in series and the sphere-to-sphere coupling with the individual filter input and output connections.

FIG. 9 shows two identical schematic cross-sectional side views in elevation showing YIG band pass filters 901 and 903 in series as may be preferred in some embodiments. In this embodiment, each includes three ferrimagnetic (YIG) resonators, $Y_1$, $Y_2$, $Y_3$, configured about a conductor shield 902, 904. The upper dielectric materials 907a, 909a, respectively, and lower dielectric materials, 907b, 909b, respectively, have a high dielectric constant. Upper RF flux lines 911 and 915 through the dielectric materials 907 and 909, respectively, are compact. However, because no dielectric materials are disposed at the 903 YIG band pass filter, lower RF flux lines 913 and 917 of YIG band pass filters 903 are not as compact as RF flux lines 907a, 907b, and the flux lines 917, 913 require any conductive boundary to be further away from the sphere, or greater RF loss will occur. This added distance results in a larger working gap requirement and a larger filter. Therefore, the dielectric materials 907 and 909 compress the path of the RF flux lines more than low dielectric materials. The upper dielectric materials 907a and 909a are shown with a cut line to represent a drafting cutaway where details of the filter structure are shown underneath the dielectric materials.

Figure 9A:
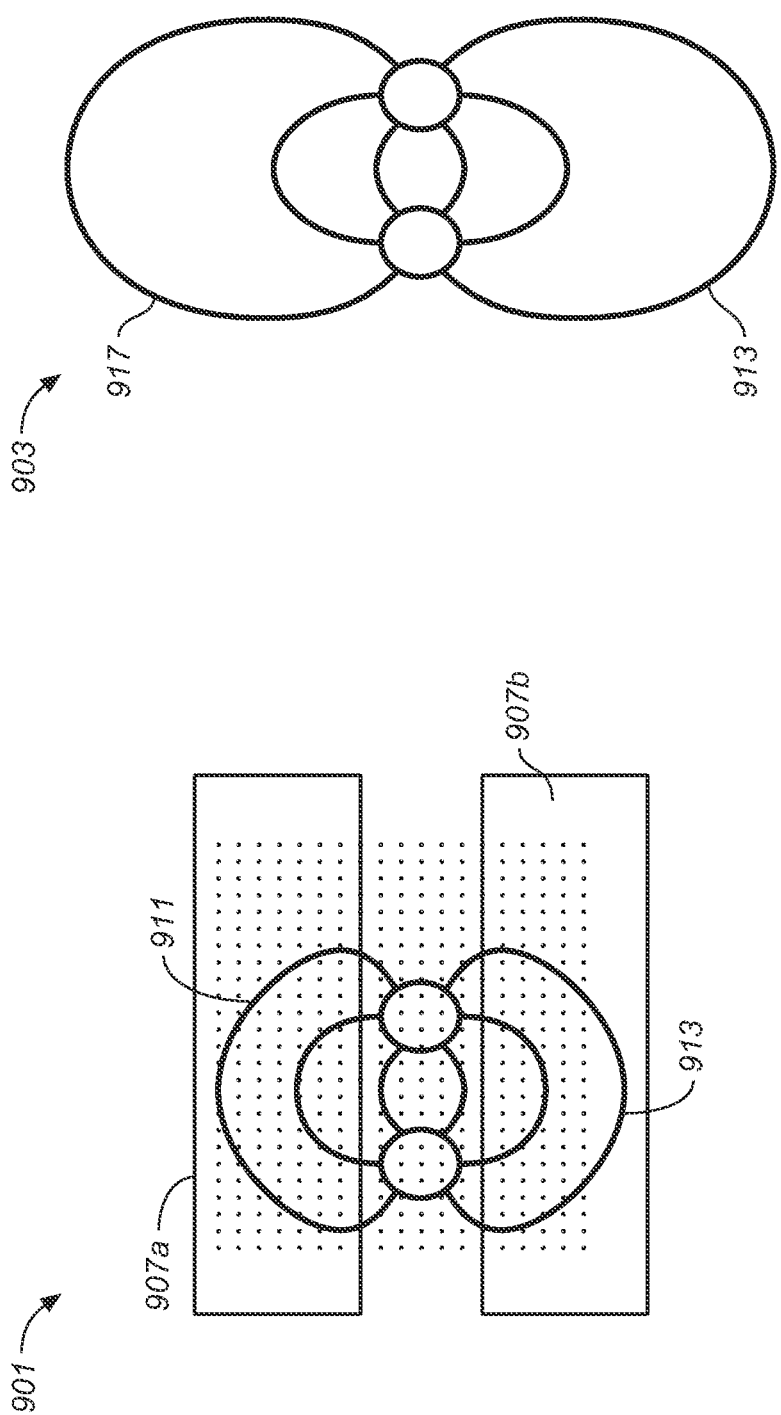
FIG. 9A is a schematic view showing RF flux lines with and without dielectric material disposed atop and below the YIG bandpass filters.
Figure 9B:
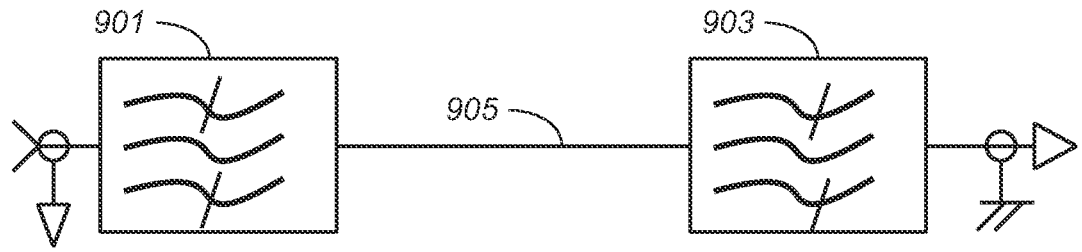
FIG. 9B is a simplified schematic diagram showing a circuit having an amplifier connected to a filter with a transverse electromagnetic connector ("TEM" connector).

FIG. 9A is a schematic representation of RF flux lines using FEM calculations of this simplified model of a YIG band pass filters 901 presented with dielectric materials 907a, 907b, and 909a, 909b, respectively, at the top and bottom portions of the YIG band pass filters 901 and visually contrasting a filter 903 that has no dielectric material and thus demonstrates the dilation of the RF flux lines when no dielectric material is provided in such a configuration. This presentation graphically establishes the effects previously discussed as the theory of operation to control RF flux in the zone of a sphere. The dielectric materials 907a, 907b, and 909a, 909b, have a high dielectric constant. Upper RF flux lines 911 and 915 through the dielectric materials 907 and 909, respectively, are compact. However, because no dielectric materials are disposed at the bottom portions of the YIG band pass filters, lower RF flux lines 913 and 917 of YIG band pass filters 901 and 903 are not as compact as RF flux lines 907, and flux lines 909 require any conductive boundary to be further away from the sphere, or greater RF loss will occur. This added distance will result in a larger working gap requirement and a larger filter. Therefore, the dielectric materials 907 and 909 compress the path of the RF flux lines more than low dielectric materials.

Figure 9C:
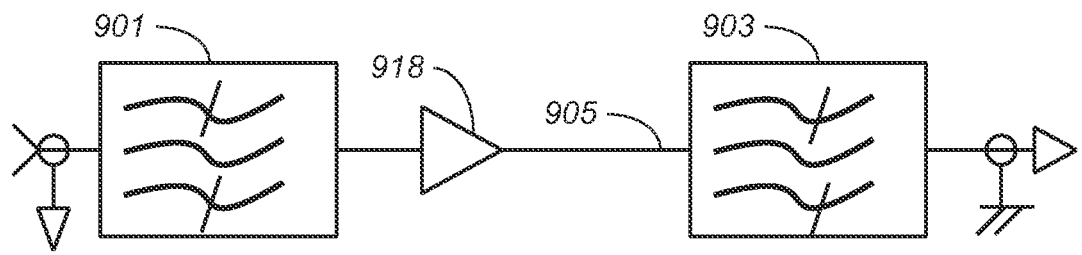
FIG. 9C shows a circuit with a low noise amplifier preceding a YIG bandpass filter to reduce noise.
Figure 9D:
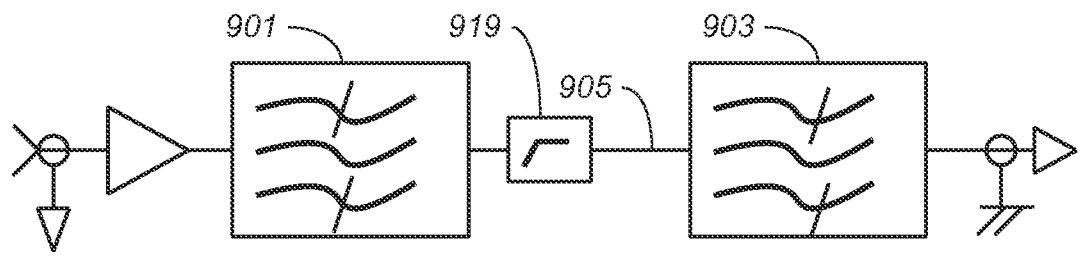
FIG. 9D shows a circuit with a limiter or pad to reduce power to the second circuit as necessary.
Figure 9E:
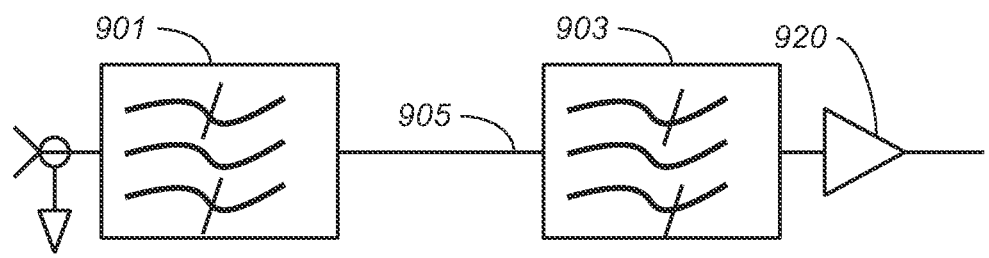
FIG. 9E shows a circuit with an amplifier at the output to increase the RF level.
Figure 9F:
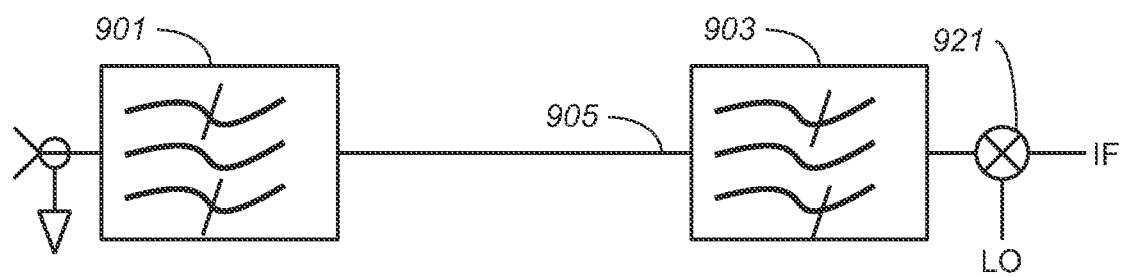
FIG. 9F shows a circuit having a filter assembly driving a mixer to upconvert or downconvert an RF signal for preselector applications.

These circuits are shown in simplified block diagrams 9B-9F that show a first filter 901 and a second filter 903 connected by a line 905. In FIG. 9C, there is shown an amplifier 918 in addition to line 905 to connect filter 901 to filter 903. In FIG. 9D, there is shown a circuit with a low noise amplifier before the filter 901 to reduce noise and a limiter or pad 919 to reduce power to the second filter 903 as necessary. FIG. 9E shows an amplifier 920 at the output to increase the RF level. FIG. 9F shows the filter assembly driving a mixer 921 that can be used to up or down convert an RF signal for preselector applications. Any combination of these circuits should be considered an application covered by this invention.

The YIG band pass filters 901 and 903 are provided with dielectric materials 907a, 907b, and 909a, 909b, respectively, at the top portions of the YIG band pass filters 901 and 903. The dielectric materials 907 and 909 are materials of high dielectric strength. Upper RF flux lines 911 and 915 through the dielectric materials 907a-b and 909a-b, respectively, are compact. However, because no dielectric materials are disposed at the bottom portions of the YIG band pass filters, lower RF flux lines 913 and 917 of YIG band pass filters 901 and 903 are not as compact as RF flux lines 907 and 909. Therefore, the dielectric materials 907a-b and 909a-b compress the path of the RF flux lines.

Figure 10:
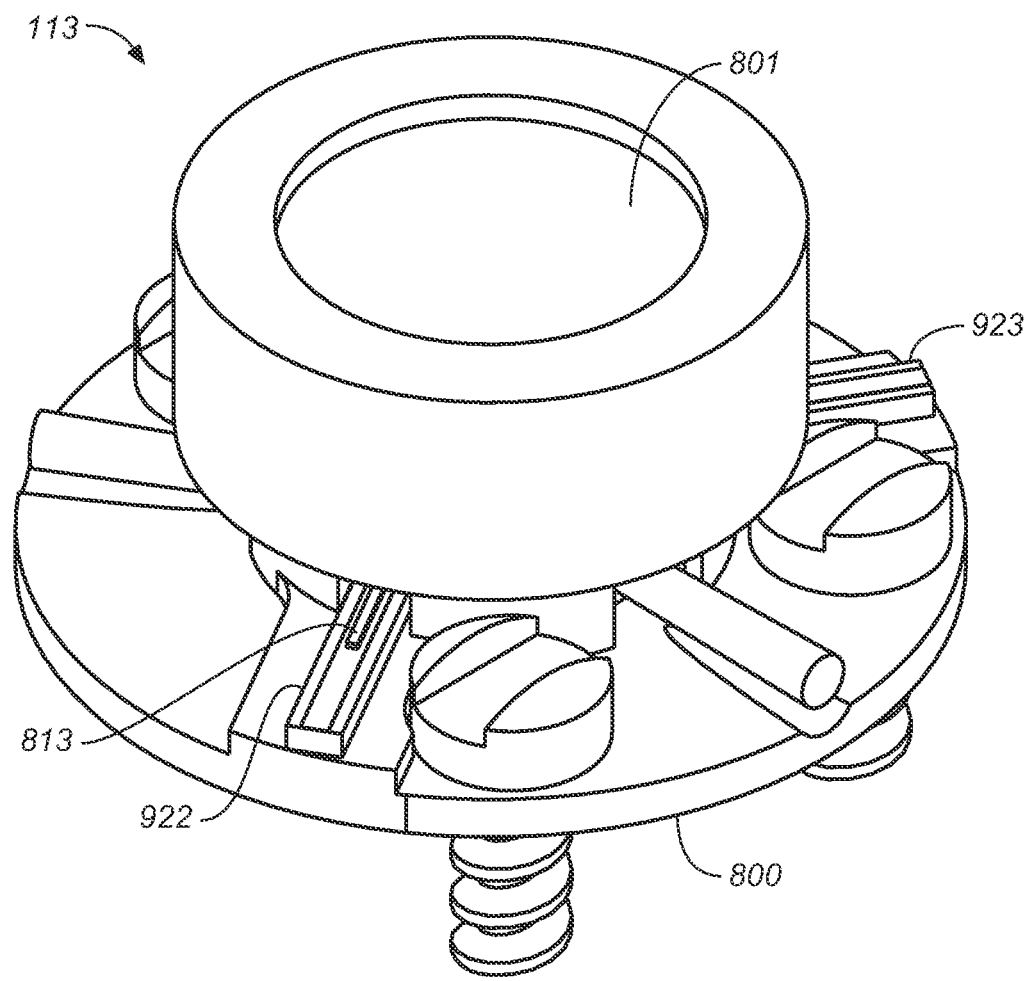
FIG. 10 is an upper perspective view of the inventive YIG filter with the upper magnetic field straightener atop a puck according to some embodiments.
Figure 11:
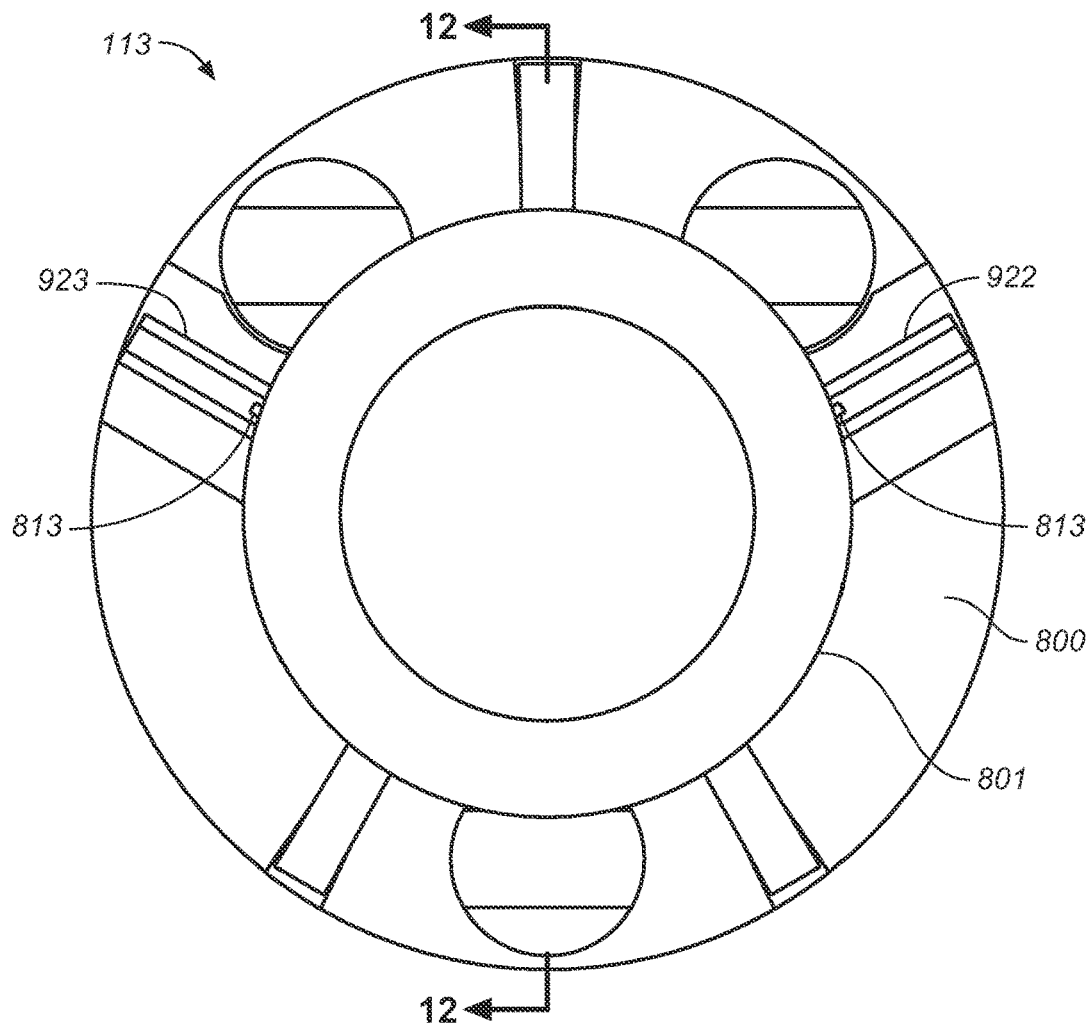
FIG. 11 is a top plan view thereof.
Figure 12:
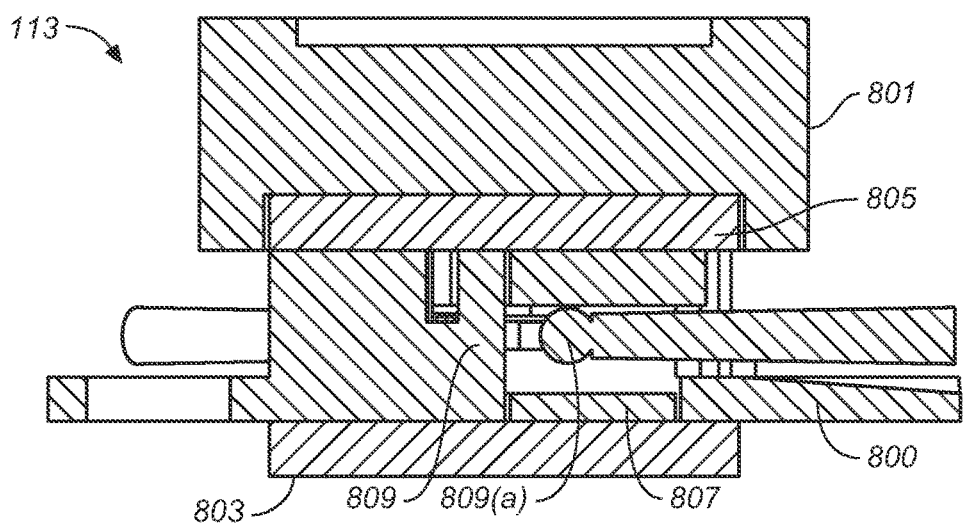
FIG. 12 is a cross-sectional side view 9-9 elevation thereof.
Figure 13:
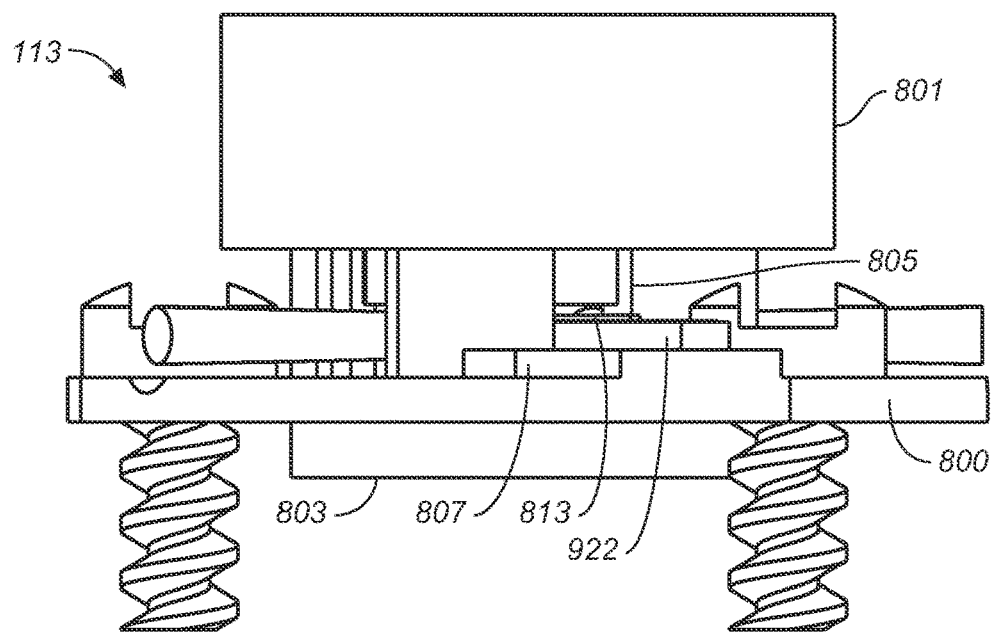
FIG. 13 is a side view in elevation thereof.
Figure 14:
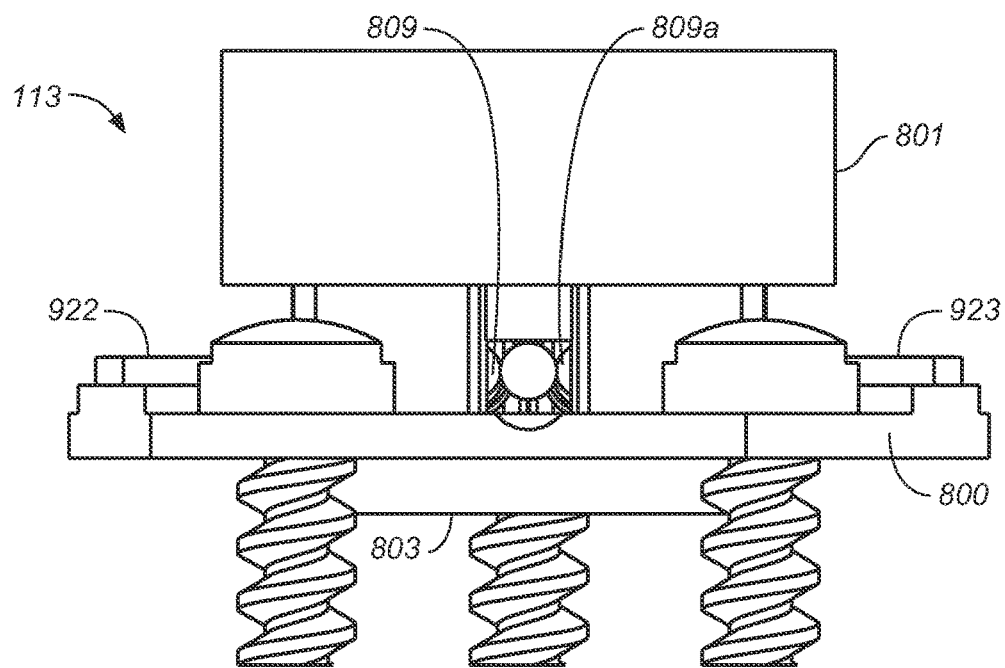
FIG. 14 is a side view in elevation thereof, rotated 90 degrees.

Looking now at FIGS. 10-14, FIG. 10 is a perspective view of the YIG filter 113, while FIG. 11 is a top plan view thereof, and FIG. 12 is a cross-sectional side view in elevation thereof. FIG. 13 is a side view in elevation thereof, and FIG. 14 is the same view rotated 90 degrees. FIG. 10 also shows the input and output transmission lines, 922 and 923. These are connected to the YIG loops 813 to direct the RF input and output power to the input and output sphere. In this embodiment the filters 901 and 903 have an input and output that is different from port to port. Thus, for the input filter 901, the port 923 is input and 922 is output while for filter 903, the port 922 is input and 923 is output.

Figure 15:
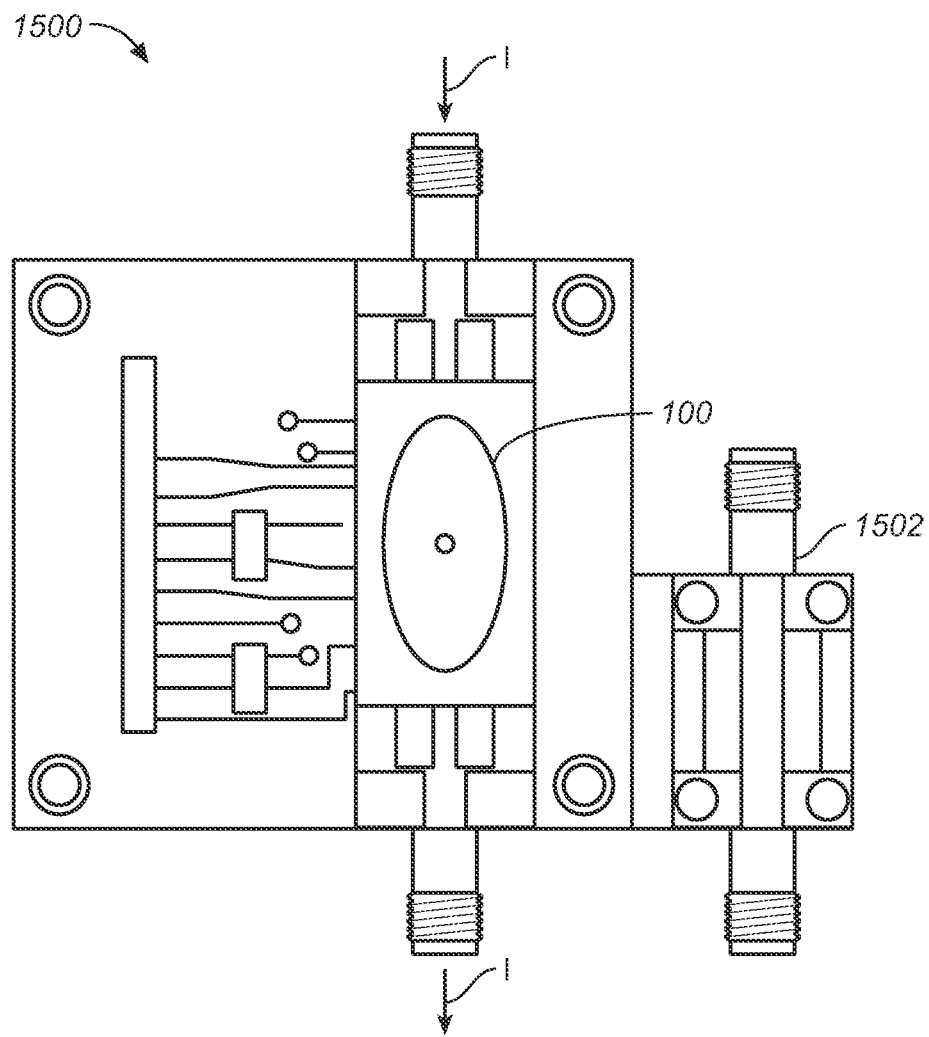
FIG. 15 is a schematic view showing of a working example of the inventive YIG filter surface mounted to a test circuit with coax connectors for input and output, according to some embodiments, with a reference circuit shown at right and provided for calibration.

FIG. 15 features a working example of YIG filter 113/115 on a test fixture 1500, showing the filter 100 attached by surface mounting. At the right is a calibration transmission line 1502 for use in evaluations.

The magnetically tunable ferrimagnetic filter 100 provides high switching speed, high power efficiency, and fundamentally low loss. Further, the magnetically tunable ferrimagnetic filter is compact in size and economical in manufacture due to the modular nature which enables simplified assembly, aligning, and testing at early stages of production. This is accomplished by designing fixtures that can be reused with each assembly unlike the current YIG filter products that are "tweaked" to work after all the components are assembled. Historically, the technician that is successful in balancing all the effects of a YIG filter is a rare talent and command a high compensation. There is also a sever burden to high production which has led to the high cost of YIG products. This invention saves material cost and production cost by simplifying labor and eventually enabling robotic assembly. The compact size and high-power efficiency may promote magnetically tunable devices and Monolithic Microwave Integrated Circuit (MMIC) to the product standard currently occupied by electron charge devices. The YIG filter 113 may be used in tuners, oscillators, and large-scale integration that operate in microwave frequency spectrum. Additionally, or alternatively, the YIG filter 113 may be incorporated in digital devices, for instance, to yield miniature DACs and ADC that have crystal oscillator stability specifications and jitter specifications at 10 GHz and greater. Furthermore, the YIG filter 113 may be usefully incorporated in radar applications and robotics.

The foregoing description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Many modifications and other embodiments of the inventions set forth herein will occur to one skilled in the art to which the invention pertains, but only in virtue of having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

Therefore, the above description and illustrations should not be construed as limiting the scope of the invention, which is defined by the claims set forth herein and filed concurrently herewith.

What is claimed as invention is:

1. A magnetically tunable ferrimagnetic filter, comprising:
   a top magnetic conductor having integral first and second cylindrical poles;
   a bottom magnetic conductor;
   at least first and second tunable coils disposed between said top magnetic conductor and said bottom magnetic conductor, said first tunable coil surrounding said first cylindrical pole and configured to create a first polarity, said second tunable coil surrounding said second cylindrical pole and configured to create a second polarity opposite that of said first polarity, each of said first and second cylindrical poles spaced apart from said bottom magnetic conductor to form a magnetic gap;
   at least two ferrimagnetic-based filters;
   an enclosure; and
   coupling structure to capture and secure within said enclosure, in an assembly, said top magnetic conductor, said bottom magnetic conductor, said first and second tunable coils, and said at least two ferrimagnetic-based filters;
   wherein each of said at least two ferrimagnetic-based filters are disposed on a mounting platform and include a plurality of ferrimagnetic resonator elements surrounded or partially surrounded by a radio frequency (RF) structure that couples high frequency electromagnetic (RF) energy to said ferrimagnetic resonator elements.

2. The magnetically tunable ferrimagnetic filter of claim 1, wherein said ferrimagnetic-based filters each include a top metallic plate disposed at a top portion of said mounting platform, a bottom metallic plate disposed at a bottom portion of said mounting platform, a top dielectric material connected to said top metallic plate and disposed between said top metallic plate and said mounting platform, a bottom dielectric material connect connected to said bottom metallic plate and disposed between said bottom metallic plate and said mounting platform adjacent said ferrimagnetic resonator elements.

3. The magnetically tunable ferrimagnetic filter of claim 2, wherein said top dielectric material and said bottom dielectric material are configured to confine and shape a contour of RF flux lines.

4. The magnetically tunable ferrimagnetic filter of claim 2, wherein said ferrimagnetic resonator elements are yttrium-iron-garnet (YIG) spheres.

5. The magnetically tunable ferrimagnetic filter of claim 1, wherein said ferrimagnetic resonator elements are YIG spheres.

6. The magnetically tunable ferrimagnetic filter of claim 1, further including a balance coil disposed between said at least first and second tunable coils.

7. The magnetically tunable ferrimagnetic filter of claim 1, wherein said enclosure includes a top casing and a bottom casing.

8. The magnetically tunable ferrimagnetic filter of claim 1, wherein each of said at least two ferrimagnetic-based filters includes a plurality of ferrimagnetic resonators to provide more than one filter characteristic and to promote filter tracking between said at least two filters over temperature and tuning frequency.

9. A magnetically-tunable ferrimagnetic radio frequency (RF) circuit comprising:
   a magnetic circuit comprising a gap;
   a tuning coil magnetically coupled to the magnetic circuit;
   a resonant cavity at least partially defined by a first magnetically conductive member spaced apart from a second magnetically conductive member, and a side wall, the resonant cavity located within the gap of the magnetic circuit;
   first and second ferrimagnetic elements arranged in spaced apart relation within the resonant cavity; and
   a transmission line comprising a first portion located for RF coupling to the first ferrimagnetic element, and a second portion located for RF coupling to the second ferrimagnetic element;
   a third ferrimagnetic element located within the resonant cavity and spaced apart from the first and second ferrimagnetic elements; and a shield conductor located at least partially between the first and second ferrimagnetic elements;
   wherein the first portion of the transmission line is a first RF coupling loop disposed at least partially about and separated from the first ferrimagnetic element, and the second portion of the transmission line is a second RF coupling loop disposed at least partially about and separated from the second ferrimagnetic element, and where the transmission line is devoid of an RF coupling portion proximate the third ferrimagnetic element.

10. The magnetically-tunable ferrimagnetic RF circuit of claim 9, the first, second, and third ferrimagnetic elements located in a common plane.

11. The magnetically-tunable ferrimagnetic RF circuit of claim 9, the third ferrimagnetic element arranged symmetrically between the first and second ferrimagnetic elements.

12. The magnetically-tunable ferrimagnetic RF circuit of claim 9, the first, second, and third ferrimagnetic elements each comprise a yttrium-iron-garnet (YIG) sphere.

13. The magnetically-tunable ferrimagnetic RF circuit of claim 9, the first, second, and third ferrimagnetic elements located between first and second dielectric members in the resonant cavity.

14. A magnetically-tunable ferrimagnetic radio frequency (RF) circuit comprising:
- a magnetic circuit comprising a gap;
- a tuning coil magnetically coupled to the magnetic circuit;
- a resonant cavity at least partially defined by a first magnetically conductive member spaced apart from a second magnetically conductive member, and a side wall, the resonant cavity located within the gap of the magnetic circuit;
- first and second ferrimagnetic elements arranged in spaced apart relation within a space between first and second dielectric members located in the resonant cavity;
- a transmission line comprising a first RF coupling loop portion disposed at least partially about the first ferrimagnetic element, and a second RF coupling loop portion disposed at least partially about the second ferrimagnetic element;
- a third ferrimagnetic element located between the first and second dielectric members and spaced apart from the first and second ferrimagnetic elements; and
- a shield conductor located at least partially between the first and second ferrimagnetic elements,
- wherein RF energy is couplable between the third ferrimagnetic element and the first and second ferrimagnetic elements, and the third ferrimagnetic element does not have a transmission line portion located for RF coupling to the third ferrimagnetic element.

15. The magnetically-tunable ferrimagnetic RF circuit of claim 14, the first, second, and third ferrimagnetic elements located in a common plane.

16. The magnetically-tunable ferrimagnetic RF circuit of claim 14, the first, second, and third ferrimagnetic elements each comprise a yttrium-iron-garnet (YIG) sphere.

17. The magnetically-tunable ferrimagnetic RF circuit of claim 14, the first, second, and third ferrimagnetic elements located in a common plane between the first and second dielectric members.

18. The magnetically-tunable ferrimagnetic RF circuit of claim 17, the first, second, and third ferrimagnetic elements each comprise a yttrium-iron-garnet (YIG) sphere.

* * * * *